(12) United States Patent
Jin

(10) Patent No.: US 8,024,056 B2
(45) Date of Patent: Sep. 20, 2011

(54) EXTERNAL AMPLIFIER AND NOISE REMOVING METHOD THEREOF

(75) Inventor: Sang Un Jin, Seoul (KR)

(73) Assignee: LG Electronics Inc., Seoul (KR)

( * ) Notice: Subject to any disclaimer, the term of this patent is extended or adjusted under 35 U.S.C. 154(b) by 1299 days.

(21) Appl. No.: 11/341,632

(22) Filed: Jan. 30, 2006

(65) Prior Publication Data

US 2006/0193476 A1 Aug. 31, 2006

(30) Foreign Application Priority Data

Jan. 31, 2005 (KR) .......................... 10-2005-0008829

(51) Int. Cl.
*G06F 17/00* (2006.01)
*H04B 15/00* (2006.01)
(52) U.S. Cl. .......................................... 700/94; 381/94.5
(58) Field of Classification Search .................. 700/94; 381/94.5, 94.1, 120, 123; 369/47.23
See application file for complete search history.

(56) References Cited

U.S. PATENT DOCUMENTS

| 6,694,030 | B1 * | 2/2004 | Van Steenbrugge | 381/94.5 |
| 6,904,403 | B1 * | 6/2005 | Muraki et al. | 704/212 |
| 6,988,013 | B1 * | 1/2006 | Fujishita | 700/94 |
| 2003/0023332 | A1 * | 1/2003 | Sugiyama et al. | 700/94 |

FOREIGN PATENT DOCUMENTS

KR     10-0387330 B1     6/2001

* cited by examiner

*Primary Examiner* — Davetta Goins
*Assistant Examiner* — Joseph Saunders, Jr.
(74) *Attorney, Agent, or Firm* — Birch, Stewart, Kolasch & Birch, LLP

(57) ABSTRACT

An external amplifier and a noise removing method thereof are disclosed. When an audio output inputted to the external amplifier is changed from a first mode to a second mode, channel status information is set to the second mode and no data of the audio output is outputted in the second mode for a predetermined period of time. Therefore, it is possible to remove noise that is generated in the external amplifier when the audio output mode is changed, thereby preventing speaker damage.

24 Claims, 4 Drawing Sheets

US 8,024,056 B2

EXTERNAL AMPLIFIER AND NOISE REMOVING METHOD THEREOF

This application claims the benefit of the Korean Patent Application No. 10-2005-0008829, filed on Jan. 31, 2005, which is hereby incorporated by reference as if fully set forth herein.

BACKGROUND OF THE INVENTION

1. Field of the Invention

The present invention relates to an external amplifier, and more particularly, to an apparatus and method for removing noise that is generated in an external amplifier when the audio output mode of a digital receiver is changed.

2. Discussion of the Related Art

A digital receiver, such as a digital television (DTV) or set-top box (STB), has a Sony Philips Digital Interface (SPDIF) output for digital audio transmission, which is connected to an external amplifier so as to be reproduced.

When audio is reproduced in the external amplifier, it is possible to obtain sound of higher quality, more channels, more various sound field effects, higher power, etc. than output sound from the digital receiver. Therefore, the user can enjoy a more realistic digital broadcast.

At present, the digital receiver can receive an analog broadcast, as well as a digital broadcast. Particularly, the digital television may receive an SPDIF input from an external digital device, such as a digital versatile disc (DVD) player, decode it and then provide the decoded result again as an SPDIF output, or may receive an analog L/R signal from an external analog device, such as a video cassette recorder (VCR), and provide it as an SPDIF output of a pulse code modulation (PCM) mode.

The SPDIF output mode is generally contained in an audio menu of the digital receiver, and is selected to suit the user's situation or automatically changed by the digital receiver according to a given broadcast or an external input source.

Audio transmitted when the user views a digital broadcast through the digital receiver, is an Encoded audio stream. The Encoded audio stream can be defined by various standards, such as AC3, Advanced Audio Coding (AAC) and Moving Picture Experts Group (MPEG). At present, the audio standard is AC3 in Korean and North American digital broadcastings.

In this digital audio environment, the user can select a desired one of an Encoded mode or PCM mode as the SPDIF output mode. For example, provided that the user has an amplifier capable of decoding an SPDIF output of the Encoded mode, he/she will generally select the SPDIF output of the Encoded mode to enjoy multichannel, high-quality sound.

In contrast, provided that the user has an amplifier incapable of decoding an SPDIF output of the Encoded mode, or an amplifier capable of receiving audio of an L/R 2 channel and providing a specific sound field effect, he/she will select an SPDIF output of the PCM mode. Similarly, for a digital television that receives an input from an external digital device such as a DVD player, the user can also select the SPDIF output mode.

On the other hand, in the case where the user views an analog broadcast through the digital receiver or an analog video from an external analog device connected with the digital receiver, the digital receiver analog/digital (A/D)—converts an analog L/R signal from the external analog device and provides the resulting signal as an SPDIF output of the PCM mode. In this case, even though the user selects the Encoded mode as the SPDIF output mode, the digital receiver automatically provides the SPDIF output in the PCM mode.

Accordingly, the user can change the SPDIF output mode from the PCM mode to the Encoded mode in the audio menu while viewing a digital broadcast, or the change of the SPDIF output mode from the PCM mode to the Encoded mode can be made upon a channel change from an analog channel to a digital channel, a source change from an analog channel to an external digital device, a source change from an external analog device to a digital broadcast, and a source change from an external analog device to an external digital device.

For a distinction between the Encoded mode and PCM mode of the SPDIF output, SPDIF channel status information is generally used, as will hereinafter be described with reference to the annexed drawings.

FIG. 1 illustrates the SPDIF channel status information.

As shown in FIG. 1, the channel status information includes various information for proper decoding of the SPDIF output by an external amplifier, in which the first bit of byte 0 indicates whether the SPDIF output mode is the PCM mode or Encoded mode.

That is, the first bit indicates the PCM mode if it is 0 and the Encoded mode if it is 1. This bit is also referred to as an Audio/Non Audio bit.

Therefore, the external amplifier determines whether the SPDIF output inputted thereto is in the Encoded mode or PCM mode, by periodically checking the first bit of byte 0 of the channel status information, and sets a decoder IC therein for proper decoding of the SPDIF output according to the determination result.

On the other hand, in this process of determining whether the SPDIF output is in the PCM mode or Encoded mode and processing the SPDIF output according to the determination result, noise is generated in the external amplifier when the SPDIF output mode is changed from the PCM mode to the Encoded mode, as will hereinafter be described with reference to FIG. 2.

FIG. 2 illustrates a process of noise generation in a conventional external amplifier when the SPDIF output mode is changed from the PCM mode to the Encoded mode.

When the SPDIF output mode of the digital receiver is changed from the PCM mode to the Encoded mode, the SPDIF data is changed from a PCM bit stream to an Encoded bit stream and, at the same time, the Audio/Non Audio bit of the channel status information is changed from the PCM mode ('0') to the Encoded mode ('1').

However, the external amplifier cannot immediately recognize the change of the SPDIF output mode from the PCM mode to the Encoded mode. For this reason, the external amplifier outputs an SPDIF input with an Encoded bit stream as sound of the PCM mode until it recognizes the mode change, causing noise.

In other words, the external amplifier has mode change check times T1, T2 and T4 at intervals of typically 100 ms or 200 ms, as shown in FIG. 2. In the case where the mode change is made at a time T3 between the check times, noise is generated for a period from the time T3 to the next check time T4.

In this case, the noise may be serious and the speaker may be subject to damage resulting from an abrupt sound variation.

SUMMARY OF THE INVENTION

Accordingly, the present invention is directed to an external amplifier and a noise removing method thereof that substantially obviate one or more problems due to limitations and disadvantages of the related art.

An object of the present invention is to provide an apparatus and method for removing noise that is generated in an external amplifier when the SPDIF output mode of an audio device is changed from a PCM mode to an Encoded mode.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for removing noise in an external amplifier connected with an audio device, comprising the step of, if an audio output of the audio device is changed from a first mode to a second mode, setting channel status information to the second mode and outputting data of the audio output in the first mode for a predetermined period of time.

The first mode may be a pulse code modulation (PCM) mode and the second mode may be an Encoded mode.

The audio output of the audio device may be a Sony Philips Digital Interface (SPDIF) output.

The predetermined time period may be longer than a check period of the external amplifier for the channel status information.

In another aspect of the present invention, there is provided a method for removing noise in an external amplifier connected with an audio device, comprising the step of, if an audio output of the audio device is changed from a first mode to a second mode, setting channel status information to the second mode and outputting no data of the audio output in the second mode for a predetermined period of time.

In yet another aspect of the present invention, an external amplifier comprises: a decoding module for decoding data of an audio output of an audio device according to an algorithm corresponding to mode information of channel status information, converting the decoded data into an analog signal and outputting the converted analog signal; and a controller for, if the audio output of the audio device is changed from a first mode to a second mode, setting the channel status information to the second mode and inhibiting the audio output data from being inputted to the decoding module in the second mode for a predetermined period of time.

Preferably, the controller periodically checks the mode information of the channel status information and outputs the checked mode information to the decoding module.

The controller may input the audio output data to the decoding module in the form of PCM data or null data for the predetermined time period.

In a feature of the present invention, it is possible to remove noise that is generated in an external amplifier when the SPDIF output mode is changed from a PCM mode to an Encoded mode, thereby preventing speaker damage.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

The terminology used herein includes terms defined taking into consideration functions implemented in the present invention, and the definition thereof may be changed in accordance with the intention of skilled persons in the technical field or the custom in the technical field. Accordingly, the definition of the terminology must be determined based on the whole content of the present invention.

It should be noted here that the term 'external amplifier' used in the present invention generically refers to audio amplifiers that can be connected and used with an audio device having an SPDIF audio output.

Figure 1:
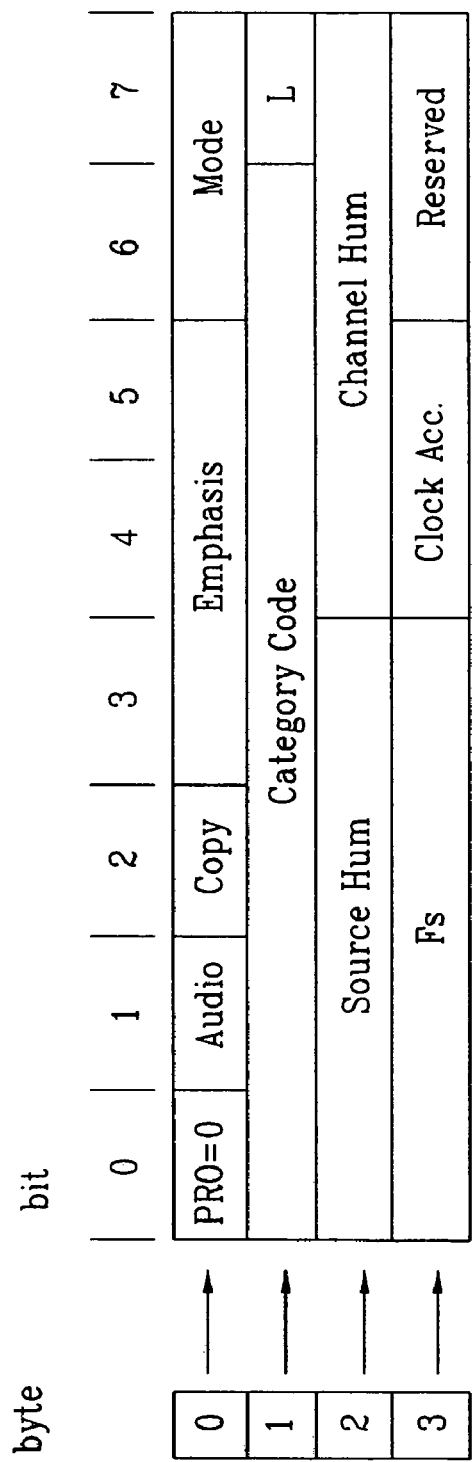
FIG. 1 is a view illustrating SPDIF channel status information.
Figure 2:
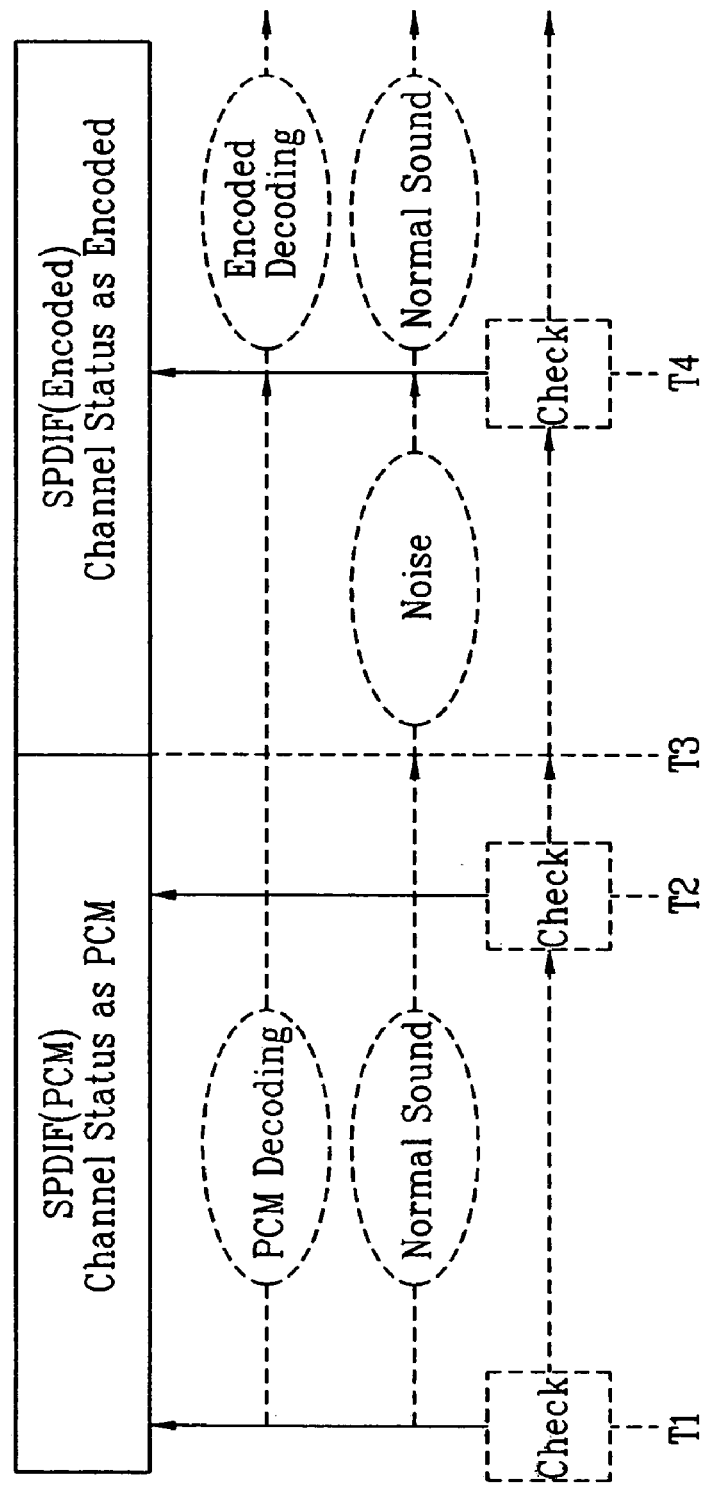
FIG. 2 is a view illustrating a process of noise generation in a conventional external amplifier when an SPDIF output mode is changed from a PCM mode to an Encoded mode.
Figure 3:
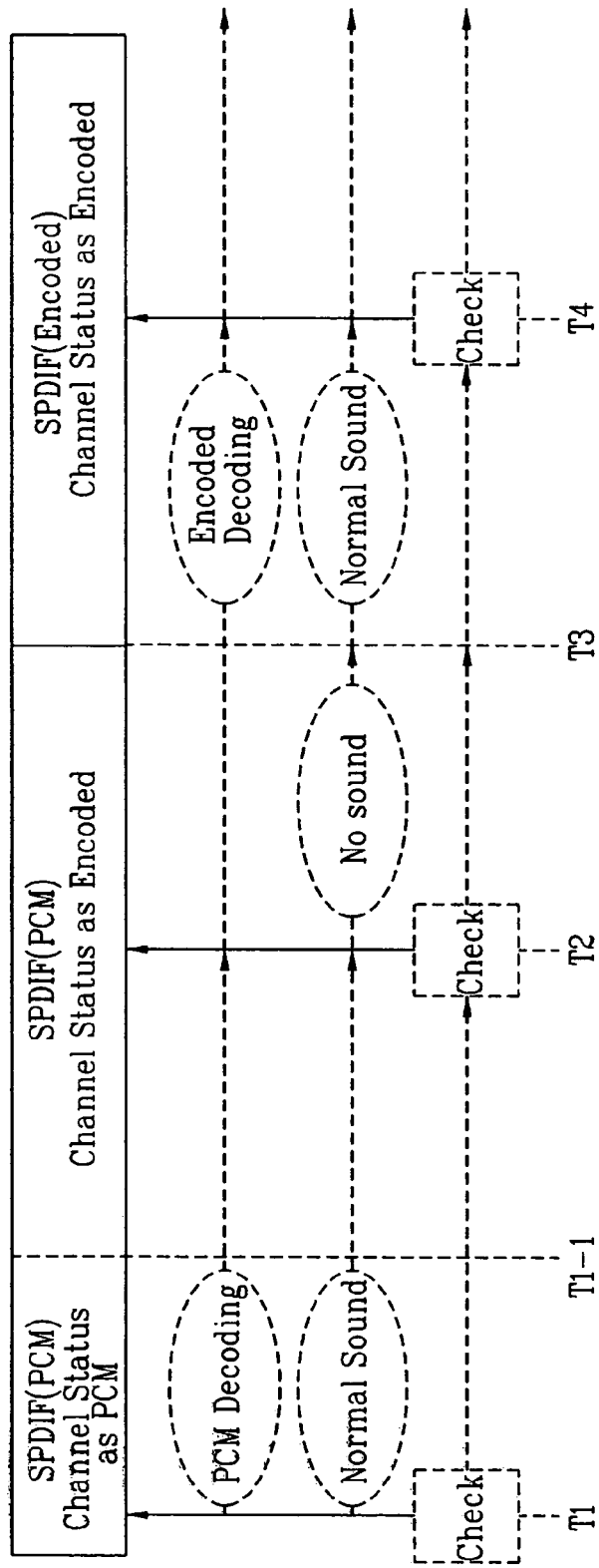
FIG. 3 is a view illustrating a mode change method for removing noise in an external amplifier when the SPDIF output mode is changed from the PCM mode to the Encoded mode, according to the present invention.

FIG. 3 illustrates a mode change method for removing noise in an external amplifier when an SPDIF output mode is changed from a PCM mode to an Encoded mode, according to the present invention.

As shown in FIG. 3, when the SPDIF output mode is changed from the PCM mode to the Encoded mode, only an Audio/Non Audio bit of channel status information is set to Non Audio while the contents of an SPDIF output are maintained in the PCM mode for a predetermined period (from a time T1-1 to a time T3). That is, the contents of the SPDIF output are in the PCM mode, but the channel status information indicates the Encoded mode.

The period from the time T1-1 to the time T3 is set to be somewhat longer than the check period of the external amplifier in consideration of the fact that the check period is generally 100 to 200 ms. In this regard, the period from the time T1-1 to the time T3 may be set to about 100 to 200 ms according to the type of the external amplifier.

Although the channel status information is changed from the PCM mode to the Encoded mode at the time T1-1, the external amplifier cannot recognize the mode change until a check time T2 is reached. As a result, the external amplifier decodes the SPDIF output inputted thereto in a PCM manner. Consequently, because the contents of the SPDIF output are in the PCM mode, the amplifier outputs sound normally.

When the time T2 is reached, the amplifier recognizes that the channel status information has been changed from the PCM mode to the Encoded mode, and then changes settings therein to decode an Encoded bit stream.

At this time, because the contents of the SPDIF output are in the PCM mode, they do not correspond to the syntax of the Encoded bit stream. As a result, the external amplifier does not decode the inputted PCM data, but discards it, so it outputs no sound. At this time, the amplifier outputs no sound until an Encoded bit stream of a valid syntax is inputted.

In other words, if the external amplifier receives an Encoded bit stream when recognizing the SPDIF output to be in the PCM mode, it decodes and outputs the Encoded bit stream owing to characteristics of the PCM mode, resulting in generation of noise. However, if the external amplifier receives PCM data when recognizing the SPDIF output to be in the Encoded mode, it does not decode the PCM data because the PCM data does not correspond to the syntax of the Encoded bit stream, so it outputs no sound (the PCM data has no syntax).

Because a valid Encoded bit stream is inputted at the time T3 of FIG. 3 under the condition that the mute period is present in the above manner, the amplifier normally decodes the Encoded bit stream from the time T3 and thus normally outputs sound.

In this manner, when an audio device, for example, a digital receiver changes the SPDIF output mode from the PCM mode to the Encoded mode, no noise is generated in the external amplifier. Of course, the output of no sound for the mute period from the time T2 to the time T3 does not matter since the mute period is short as compared with a mute time in the mode change of the digital receiver.

As an alternative, for the period from the time T1-1 to the time T3, the contents of the SPDIF output may be outputted in the form of SPDIF null data instead of the PCM data.

However, in this case, no sound is outputted for the period from the time T1-1 to the time T3 longer than the period from the time T2 to the time T3. In this regard, it is preferred that the contents of the SPDIF output are outputted in the form of the PCM data.

Figure 4:
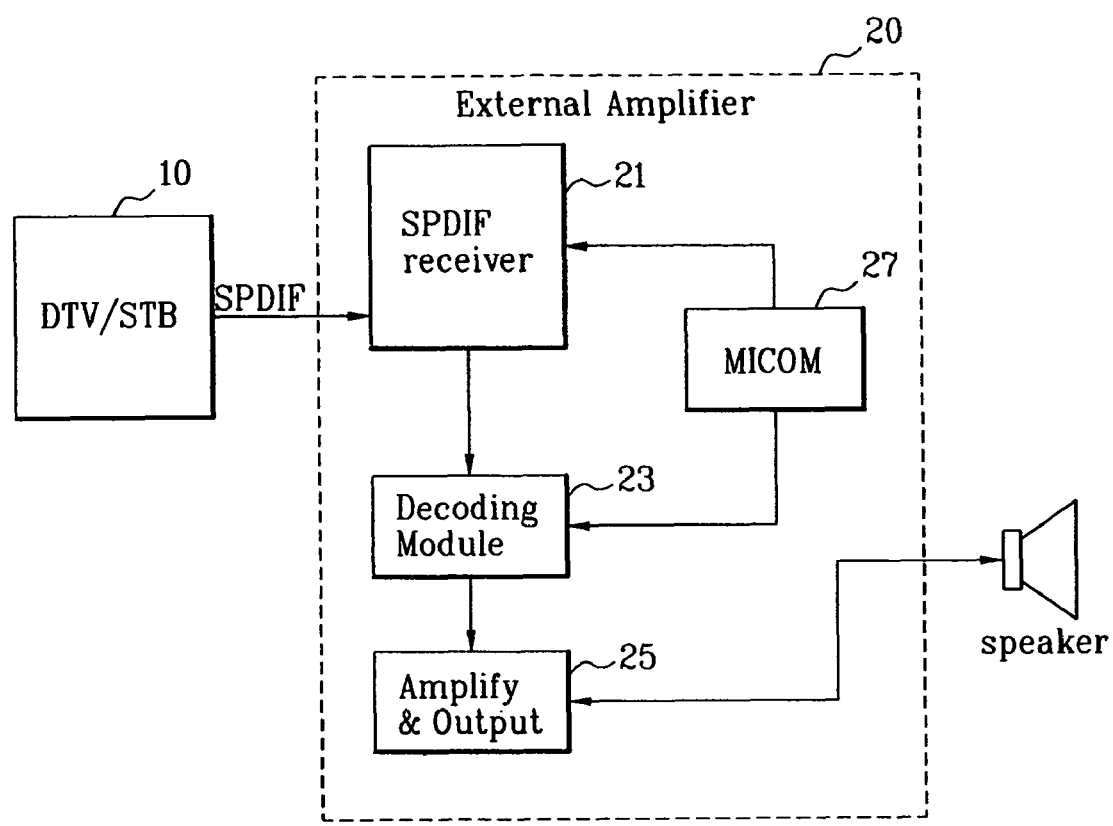
FIG. 4 is a block diagram showing the configuration of a digital receiver and external amplifier-according to the present invention.

FIG. 4 is a block diagram showing the configuration of the digital receiver to which the present invention is applied and the external amplifier according to the present invention.

As shown in FIG. 4, the external amplifier according to the present invention, denoted by reference numeral 20, an SPDIF receiver 21, a decoding module 23, an amplifier output unit 25, and a microcomputer 27.

The operation of the external amplifier 20 with this configuration will hereinafter be described briefly.

The SPDIF output of the digital receiver, denoted by reference numeral 10, is inputted to the SPDIF receiver 21. The SPDIF receiver 21 extracts channel status information from the inputted SPDIF output, rearranges data of the inputted SPDIF output and then outputs the resulting data to the decoding module 23.

At this time, the microcomputer 27 checks the extracted channel status information periodically (at intervals of 100 to 200 ms) to determine whether the SPDIF output is in the PCM mode or Encoded mode, and transfers the resulting mode information to the decoding module 23.

The decoding module 23 sets a decoder IC according to the mode information to decode the output data from the SPDIF receiver 21, convert the decoded data into an analog signal and output the converted analog signal. The analog signal is then outputted to a speaker through the amplifier output unit 25 so that the corresponding sound can be heard by the user.

In the case where the SPDIF output mode of the digital receiver 10 is changed from the PCM mode to the Encoded mode under the condition that audio is outputted through the speaker in the above manner, the digital receiver 10 sets an Audio/Non Audio bit of the channel status information to Non Audio and provides the SPDIF output in the form of PCM data for a predetermined period (about 200 ms). Thereafter, when the predetermined period has elapsed, the digital receiver 10 provides the SPDIF output in the form of Encoded data.

This operation is processed in the digital receiver 10 in a software manner. For example, the mode change is made according to the user's selection, and the channel status information change based on the mode change and the delayed output of data corresponding to the changed mode are processed in a software manner.

If the contents of the SPDIF output are in the PCM mode and the Audio/Non Audio bit of the channel status information is set to Non Audio, the decoding module 23 of the external amplifier 20 decodes the PCM contents of the SPDIF output in a PCM manner until the microcomputer 27 of the external amplifier 20 recognizes the change of the Audio/Non Audio bit. As a result, normal sound is outputted from the external amplifier 20.

At the time that the microcomputer 27 recognizes the change of the Audio/Non Audio bit, the decoding module 23 attempts to decode the PCM contents of the SPDIF output in an Encoded manner. At this time, because the PCM data does not correspond to an Encoded bit stream syntax, it is processed as an error. As a result, the external amplifier 20 enters a mute state without generating noise.

Thereafter, at the time that the digital receiver 10 normally outputs the contents of the SPDIF output, changed from a PCM bit stream to an Encoded bit stream, the external amplifier 20 decodes the Encoded bit stream, so as to output normal sound.

On the other hand, the present invention is not limited to the digital receiver, but is applicable to all audio devices having SPDIF outputs.

This invention is also applicable to the case where the external amplifier itself changes the SPDIF output from the PCM mode to the Encoded mode.

As apparent from the above description, the present invention provides an apparatus and method for removing noise that is generated in an external amplifier when the SPDIF output mode is changed from a PCM mode to an Encoded mode, thereby preventing speaker damage.

It will be apparent to those skilled in the art that various modifications and variations can be made in the present invention without departing from the spirit or scope of the inventions. Thus, it is intended that the present invention covers the modifications and variations of this invention provided they come within the scope of the appended. Claims and their equivalents.

What is claimed is:

1. A method for removing noise in an amplifier connected with an audio device, the method comprising:
    receiving an audio signal including a channel status information and audio data that are both of a first mode, and decoding the audio data according to the first mode;
    setting the channel status information of the audio signal to a second mode at a start of a predetermined period of time, while continuing to receive the audio data in the first mode for a first duration of the predetermined period of time, wherein the predetermined period of time includes the first duration and a second duration;
    switching a mode to decode the audio data from first mode to the second mode when the amplifier detects the channel status information is of the second mode, and continuing to receive the audio data in the first mode for the first and second durations of the predetermined period of time;

blocking an amplifier output of the audio data in the first mode while the decoding is in the second mode for the second duration of the predetermined period of time; and receiving the audio data in the second mode after the predetermined period of time.

2. The method as set forth in claim 1, wherein the first mode is a pulse code modulation (PCM) mode and the second mode is an Encoded mode.

3. The method as set forth in claim 1, wherein the audio signal is a Sony Phillips Digital Interface (SPDIF) output.

4. The method as set forth in claim 1, wherein the predetermined period of time is longer than a mode status check period performed by the external amplifier for detecting the channel status information.

5. The method as set forth in claim 1, wherein the predetermined period of time is 100 ms to 200 ms.

6. The method as set forth in claim 1, wherein an Audio/Non Audio bit of the channel status information is set to Non Audio for the predetermined period of time.

7. The method as set forth in claim 1, wherein the audio data is outputted in the form of PCM data for the predetermined period of time.

8. The method as set forth in claim 1, wherein the audio data is outputted in the form of null data for the predetermined period of time.

9. A method for removing noise in an amplifier connected with an audio device, the method comprising:
receiving an audio signal including a channel status information and audio data that are both of a first mode, and decoding the audio data according to the first mode;
setting the channel status information of the audio signal to a second mode at a start of a predetermined period of time, and receiving the audio data containing no data of the second mode for a first duration of the predetermined period of time, wherein the predetermined period of time includes the first duration and a second duration; and
switching a mode to decode the audio data from the first mode to the second mode when the amplifier determines the channel status information is of the second mode, and continuing to receive the audio data containing no data of the second mode during the second duration of the predetermined period of time, wherein the second duration of the predetermined period of time corresponds to when the amplifier determines the channel status information is of the second mode; and
receiving the audio data in the second mode after the predetermined period of time, and decoding the audio data in the second mode according to the second mode as indicated by the channel status information after the predetermined period of time.

10. The method as set forth in claim 9, wherein the first mode is a PCM mode and the second mode is an Encoded mode.

11. The method as set forth in claim 9, wherein the audio signal is an SPDIF output.

12. The method as set forth in claim 9, wherein the audio data is outputted in the form of PCM data for the predetermined period of time.

13. The method as set forth in claim 9, wherein the audio data is outputted in the form of null data for the predetermined period of time.

14. The method as set forth in claim 9, wherein the predetermined period of time is longer than a mode status check period performed by the external amplifier for obtaining the channel status information.

15. The method as set forth in claim 9, wherein the predetermined period of time is 100 to 200 ms.

16. The method as set forth in claim 9, wherein an Audio/Non Audio bit of the channel status information is set to Non Audio when the mode change is recognized.

17. An amplifier comprising:
a decoding module configured to decode an audio signal including a channel status information and audio data, and the decoding is accomplished according to an algorithm corresponding to a mode indicated by the channel status information, and to covert the decoded audio signal into an analog signal and output the converted analog signal; and
a controller configured to periodically check the channel status information of the audio signal to determine whether the channel status information has changed from a first mode to a second mode, and to set the channel status information to the second mode while the audio data remains in the first mode for a predetermined period of time, wherein the controller blocks an amplifier output of the audio data in the first mode while the decoding is in the second mode, and following an end of the predetermined time period, the controller allows decoding of the audio data in the second mode according to the second mode.

18. The amplifier as set forth in claim 17, wherein the controller periodically checks the mode information of the channel status information and outputs the checked mode information to the decoding module.

19. The amplifier as set forth in claim 17, wherein the first mode is a PCM mode and the second mode is an Encoded mode.

20. The amplifier as set forth in claim 17, wherein the audio signal is an SPDIF output.

21. The amplifier as set forth in claim 17, wherein the controller inputs the audio data to the decoding module in the form of PCM data for the predetermined period of time.

22. The amplifier as set forth in claim 17, wherein the controller inputs the audio data to the decoding module in the form of null data for the predetermined period of time.

23. The amplifier as set forth in claim 17, wherein the predetermined period of time is longer than a check period performed by the controller for obtaining the channel status information.

24. The amplifier as set forth in claim 17, wherein the controller sets an Audio/Non Audio bit of the channel status information to Non Audio upon recognizing the mode change.

* * * * *